United States Patent
Chen et al.

(10) Patent No.: US 7,215,542 B2
(45) Date of Patent: May 8, 2007

(54) ELECTRONIC DEVICE HAVING HEAT-DISSIPATING STRUCTURE FOR SOCKET

(75) Inventors: Yin-Yuan Chen, Taoyuan (TW); Ren-Chun Chang, Taoyuan (TW); Chen-Yu Yu, Taoyuan (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 180 days.

(21) Appl. No.: 11/173,580

(22) Filed: Jul. 1, 2005

(65) Prior Publication Data

US 2006/0104026 A1 May 18, 2006

(30) Foreign Application Priority Data

Nov. 18, 2004 (TW) ............................... 93135435 A

(51) Int. Cl.
*H05K 7/20* (2006.01)
(52) U.S. Cl. .................. 361/694; 361/695; 361/696; 361/719; 363/141; 307/150; 219/130.1; 219/136
(58) Field of Classification Search ........ 361/690–696, 361/676–679, 714–720, 722–727; 165/80.2, 165/80.3, 185, 104.33; 257/706–707, 712–713, 257/722; 454/184; 174/16.1, 16.3; 363/141, 363/146, 144; 219/130.1, 132, 133, 61.7, 219/76.11, 86.31, 125.11, 126, 58, 74; 307/42, 307/43, 64, 66, 150, 155; 211/41.1
See application file for complete search history.

(56) References Cited

U.S. PATENT DOCUMENTS

| | | | | |
|---|---|---|---|---|
| 5,642,260 A | * | 6/1997 | Sigl | ............................ 361/695 |
| 6,046,921 A | * | 4/2000 | Tracewell et al. | .......... 363/141 |
| 6,198,642 B1 | * | 3/2001 | Kociecki | ...................... 363/37 |
| 6,418,015 B1 | * | 7/2002 | Kociecki | ...................... 361/695 |
| 6,515,858 B2 | * | 2/2003 | Rodriguez et al. | .......... 361/695 |
| 6,545,872 B1 | * | 4/2003 | Lonergan et al. | ............ 361/719 |
| 6,678,157 B1 | * | 1/2004 | Bestwick | ..................... 361/695 |
| 6,831,838 B1 | * | 12/2004 | Boyce | .......................... 361/719 |
| 6,888,099 B1 | * | 5/2005 | Schneider | ................ 219/130.1 |
| 7,027,299 B2 | * | 4/2006 | Wrycraft et al. | ............ 361/695 |

FOREIGN PATENT DOCUMENTS

| JP | 363302736 A | * | 12/1988 |
|---|---|---|---|
| WO | WO 2005/048672 A1 | * | 5/2005 |

* cited by examiner

*Primary Examiner*—Michael Datskovskiy

(57) ABSTRACT

An electronic device having a heat-dissipating structure for a socket is disclosed. The electronic device comprises a case, a plurality of electronic components disposed in the case, an airflow inlet disposed at a first side of the case, a socket disposed at a second side of the case, wherein the second side is opposite to the first side and the electronic components are disposed between the first side and the second side, and an airflow directing plate disposed between the case and the electronic components and forming an airflow channel with the case for directing a portion of air at the airflow inlet to the socket through the airflow channel so as to dissipate heat of the socket. Through the design of the present invention, the heat of the socket of the electronic device can be dissipated efficiently to conform to the safety standard of the socket temperature.

19 Claims, 7 Drawing Sheets ively skilled in the art from the following detailed description and the appended claims.

ELECTRONIC DEVICE HAVING HEAT-DISSIPATING STRUCTURE FOR SOCKET

FIELD OF THE INVENTION

The present invention relates to an electronic device having a heat-dissipating structure for a socket, and more particularly to a power supply having a heat-dissipating structure for a socket.

BACKGROUND OF THE INVENTION

The power supply is an indispensable device for various electrical equipments or information products. Please refer to FIG. 1, which is a schematic diagram showing a conventional power supply. As shown in FIG. 1, the conventional power supply comprises a case 11 (shown by dotted lines), a plurality of electronic components 12, a power input element 13 and a power output element 14. The power input element 13 is usually a socket to be plugged by a power cable for inputting power, and the power output element 14 is used for electrically connecting with another electronic device for supplying power to the electronic device. In addition, the electronic components 12 will produce heat while they are operated, and the heat will cause the temperature in the case getting higher and higher. For dissipating the heat in the power supply, one or more heat-dissipating fans 15 are disposed on the case of the power supply for blowing external cold air into the case or blowing internal hot air out of the case, so as to lower down the temperature in the case and prevent the electronic components in the power supply from damage or lifespan reduce due to the overheated condition.

As shown in FIG. 1, since the air blown into the case by the fan 15 will pass through the electronic components 12 to the socket 13, the heat generated by the electronic components 12 will inevitably influence the temperature of the socket 13. According to the international safety standard of the socket temperature, the operating temperature of the socket in the power supply must be lower than 70° C. However, along with the technology development of electronic products and in response to the user's requirements, more and more electronic components are loaded on the printed circuit board (PCB) inside the power supply, resulting in the increases of the integration of the electronic components and the watt consumption of the power supply. Since the watt consumption increases, it is inevitable to increase the temperature of the whole power supply and further indirectly increase the temperature of the socket. Generally speaking, the temperature tolerance of the electronic components in the power supply reaches to about 110–150° C., but to conform to the safety standard of the socket temperature, the design of the electronic components will be confined, and accordingly, the development of the power supply will be confined.

Therefore, it is needed to provide a power supply that can efficiently dissipate heat of the socket so as to deal with the above problems encountered in the prior art.

SUMMARY OF THE INVENTION

An object of the present invention is to provide an electronic device having a heat-dissipating structure for a socket, which the heat of the socket can be dissipated efficiently to conform to the safety standard of the socket temperature.

According to an aspect of the present invention, there is provided an electronic device having a heat-dissipating structure for a socket. The electronic device comprises a case, a plurality of electronic components disposed in the case, an airflow inlet disposed at a first side of the case, a socket disposed at a second side of the case, wherein the second side is opposite to the first side and the electronic components are disposed between the first side and the second side, and an airflow directing plate disposed between the case and the electronic components and forming an airflow channel with the case for directing a portion of air at the airflow inlet to the socket through the airflow channel so as to dissipate heat of the socket.

In an embodiment, the electronic device is a power supply.

In an embodiment, the electronic device further comprises a fan for dissipating heat of the electronic components, and the fan can be disposed at the first side or the second side of the case.

In an embodiment, the airflow directing plate is made of an insulating material. For example, the airflow directing plate is formed by bending an insulating piece disposed on the top of the case downwardly.

In an embodiment, the airflow directing plate further comprises a second portion disposed between the electronic components and the socket for isolating heat generated by the electronic components.

In an embodiment, the airflow directing plate further comprises a horizontal portion at the bottom thereof for forming the airflow channel that is separated from the electronic components.

In an embodiment, the airflow directing plate is formed from a non heat-generating or low heat-generating component, such as a PCB or large capacitor.

According to another aspect of the present invention, there is provided an electronic device having a heat-dissipating structure for a socket. The electronic device comprises a case, a plurality of electronic components disposed in said case, an airflow inlet disposed at a first side of said case, a socket disposed at a second side of said case, wherein said second side is opposite to said first side and said electronic components are disposed between said first side and said second side, and an insulating piece for insulating the electronic components and the case, wherein a specific distance exists between the insulating piece and the case to form an airflow channel therebetween for directing a portion of air at the airflow inlet to the socket through the airflow channel so as to dissipate heat of the socket.

In an embodiment, the electronic device is a power supply.

In an embodiment, the electronic device further comprises a fan for dissipating heat of the electronic components, and the fan can be disposed at the first side or the second side of the case.

In an embodiment, the insulating piece is formed by bending an insulating piece disposed on the top of the case downwardly.

In an embodiment, the insulating piece further comprises a second portion disposed between the electronic components and the socket for isolating heat generated by the electronic components.

In an embodiment, the insulating piece further comprises a horizontal portion at the bottom thereof for forming the airflow channel that is separated from the electronic components.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

Some typical embodiments to present the features and advantages of the present invention will be precisely described in the following illustrations. It should be understood that the present invention may have various modifications in different modes, which are not apart from the scope of the present invention, and the illustrations and drawings of the present invention are substantially used for explaining but not for limiting the present invention.

The present invention relates to an electronic device having a heat-dissipating structure for a socket. The present techniques are illustrated with the following embodiments for a power supply, but the electronic device that is applicable to the present techniques is not limited to the power supply. Any electronic device that is applicable to the following techniques is incorporated herein for reference.

Figure 1:
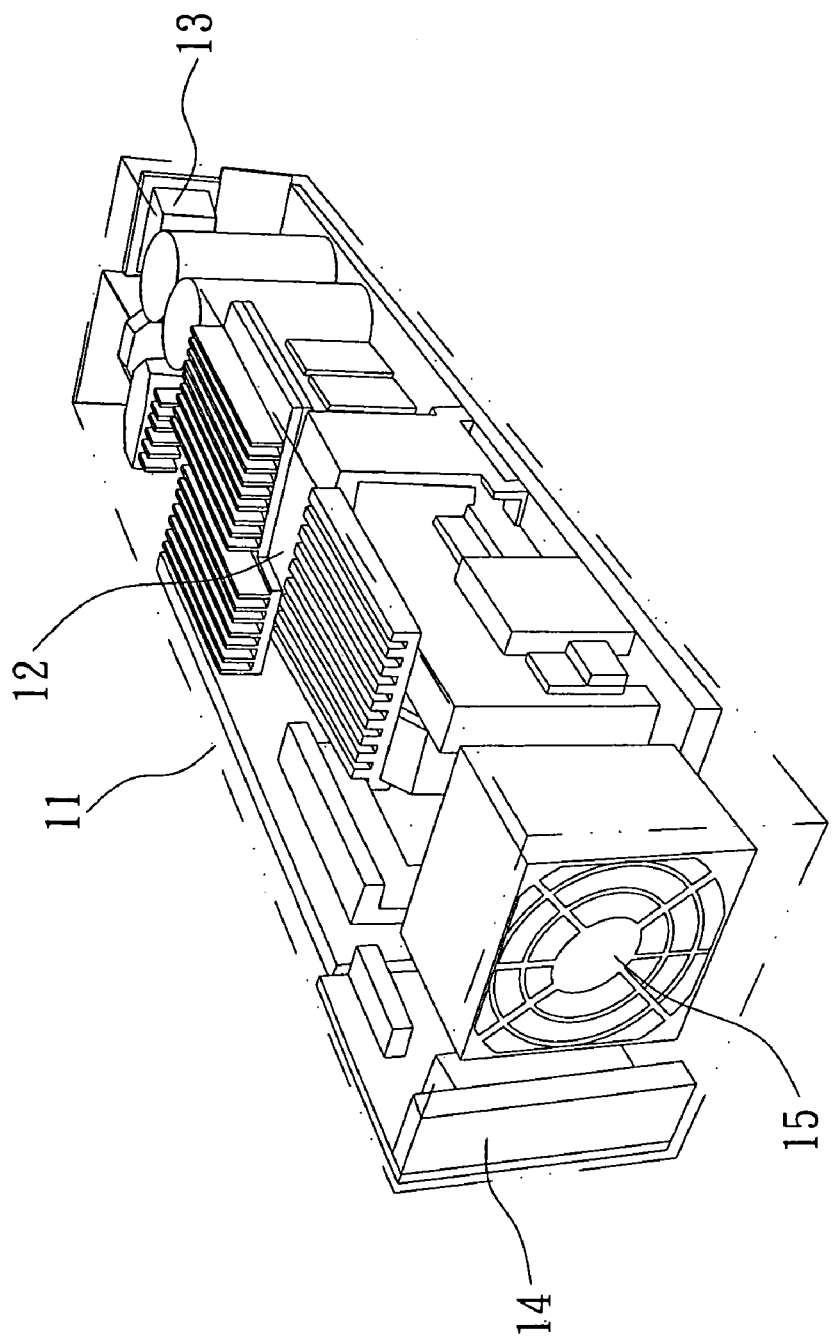
FIG. 1 is a schematic diagram showing a conventional power supply.
Figure 2:
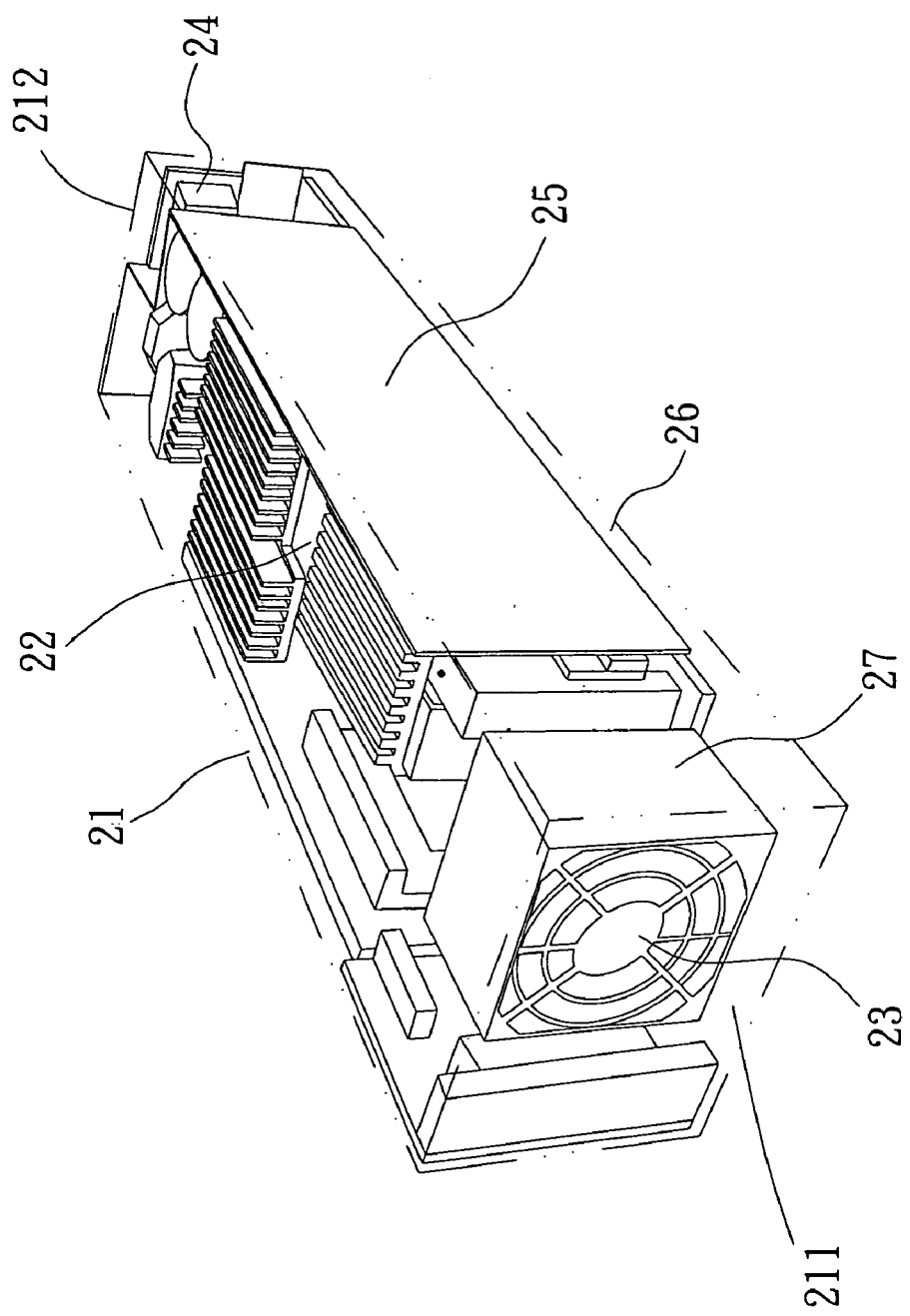
FIG. 2 is a schematic diagram showing an electronic device having a heat-dissipating structure for a socket according to a first preferred embodiment of the present invention.

Please refer to FIG. 2, which is a schematic diagram showing an electronic device having a heat-dissipating structure for a socket according to a preferred embodiment of the present invention. As shown in FIG. 2, the electronic device is a power supply, which comprises a case 21 (shown by dotted lines), a plurality of electronic components 22, an airflow inlet 23, a socket 24 and an airflow directing plate 25. The plurality of electronic components 22 are disposed in the case 21. The airflow inlet 23 is disposed at a first side of the case 21, and the socket 24 is disposed at a second side of the case 21, wherein the second side is opposite to the first side, and the electronic components 22 are disposed between the first side and the second side. The airflow directing plate 25 is disposed between the case 21 and the electronic components 22.

The disposition of the airflow directing plate 25 not only isolates the heat generated by the electronic components 22, but also forms an airflow channel 26 with the case 21, so that a portion of air, which enters the case 21 through the airflow inlet 23 and has lower temperature, can be directed to the socket 24 directly for dissipating heat of the socket without flowing through the electronic components which produce heat, so as to reduce the thermal effect to the socket 24 caused by the electronic components 22, and conform to the safety standard of the socket temperature.

The power supply of the present invention further comprises a heat-dissipating fan 27, which is disposed at the airflow inlet 23. Under the operation of the power supply, the running of the fan 27 can increase the heat-dissipating efficiency of the electronic components 22, and simultaneously facilitate a portion of air at the airflow inlet 23 flowing to the socket 24 through the airflow channel 26 rapidly, so as to dissipate heat of the socket 24 efficiently. In an embodiment, the fan 27 is disposed close to the airflow channel 26 to enhance the heat-dissipating efficiency of the airflow channel 26 to the socket 24.

Figure 3:
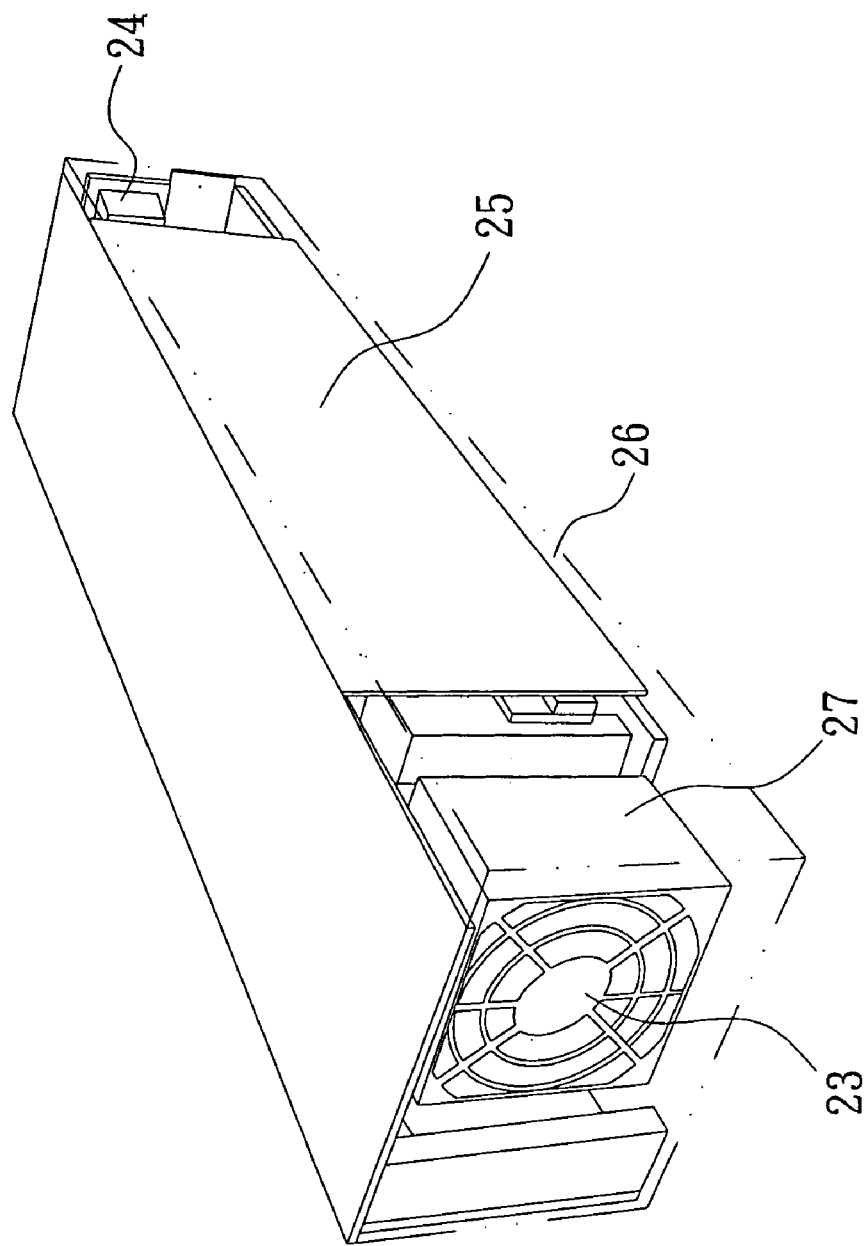
FIG. 3 is a schematic diagram showing an electronic device having a heat-dissipating structure for a socket according to a second preferred embodiment of the present invention.

More particularly, another feature of the present invention is that the airflow directing plate 25 is made of an insulating material, and thus, the airflow directing plate 25 can substitute the insulating piece originally attached to the case 21 or the insulating material originally coated on the case 21. In other words, the airflow directing plate 25 has an insulation effect to insulate the electronic components 22 and the case 21. From another viewpoint, the airflow directing plate 25 of the present invention actually can be formed by moving the insulating piece originally attached to the case 21 inwardly a specific distance, so as to form the airflow channel 26 between the insulating piece and the case 21 for directing a portion of air at the airflow inlet 23 to the socket 24 through the airflow channel 26 and dissipating heat of the socket 24. In an embodiment, the airflow directing plate 25 can be formed by bending the insulating piece attached to the inner sidewall at the top of the case 21 downwardly, as shown in FIG. 3.

Figure 4:
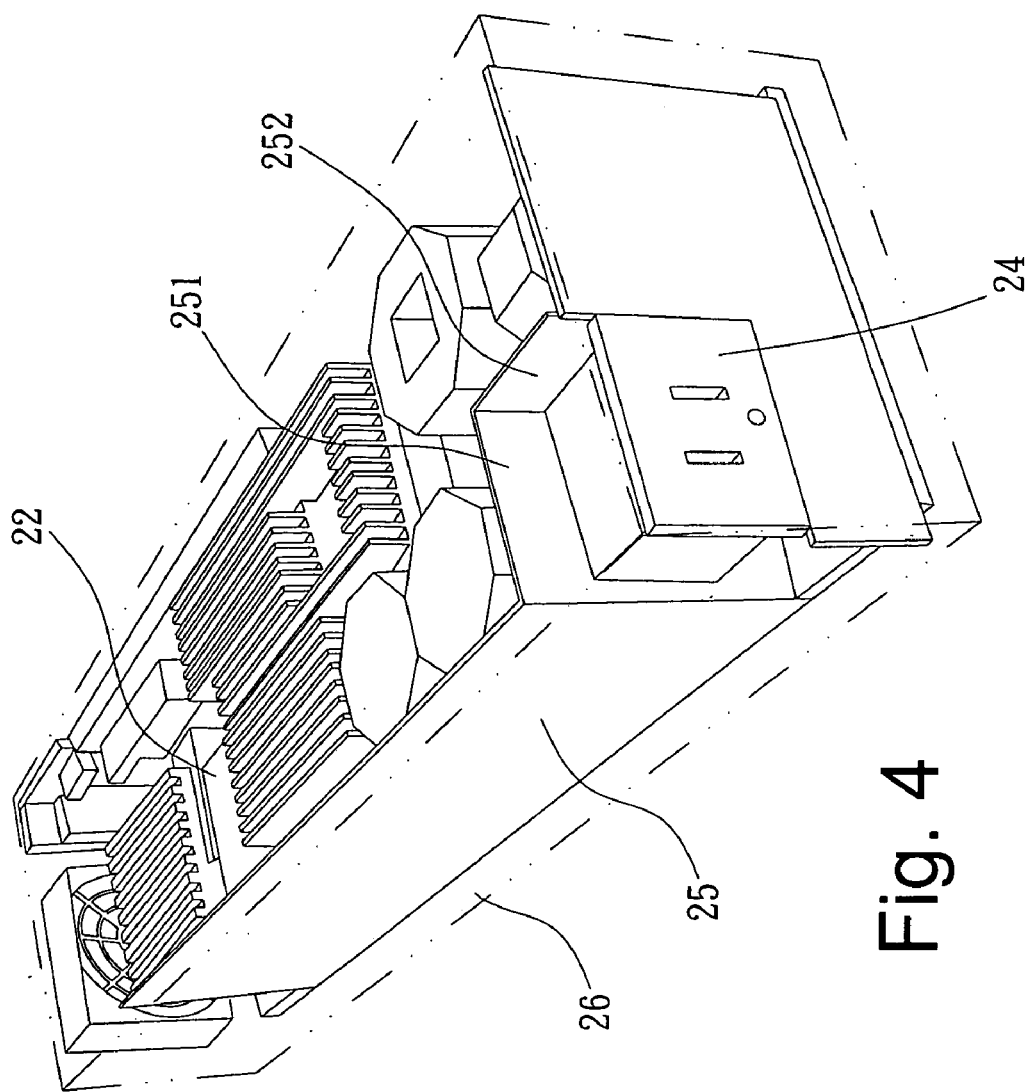
FIG. 4 is a schematic diagram showing an electronic device having a heat-dissipating structure for a socket according to a third preferred embodiment of the present invention.

Please refer to FIG. 4, which shows another side view of the electronic device having a heat-dissipating structure for a socket form according to a preferred embodiment of the present invention. As shown in FIG. 4, except the main portion which forms the airflow channel 26 with the case 21, the airflow directing plate 25 further comprises a second portion 251 and a third portion 252 respectively disposed between the socket 24 and the electronic components 22 for blocking the heat generated by the electronic components 22 under operation from conducting to the socket 24 to lower down the temperature of the socket 24.

The heat-dissipating efficiency of the airflow directing plate according to the design of the present invention is tested in the following embodiment. The power supply is an 800 watt server power supply with the length, width and height of 281.5 mm, 82 mm and 55.4 mm, respectively. A fan with a rotating speed of 15000 RPM is disposed at the airflow inlet, and the width of the airflow channel, i.e. the distance between the airflow directing plate and the case, is about 4 mm. The environmental temperature at the airflow inlet is 50° C., and the temperature of the socket under operation at two randomly selected points is measured. The results are shown in the following Table 1.

TABLE 1

| No. | N | Y |
| --- | --- | --- |
| 1 | 82.4° C. | 69.5° C. |
| 2 | 81.2° C. | 67.5° C. |

Y/N represent that the power supply is constructed with/without the airflow directing plate, respectively. It could be known from Table 1 that the temperature of the socket in the power supply with the heat-dissipating structure of the present invention can be efficiently lowered down under 70° C., so it can conform to the safety standard of the socket temperature.

Figure 5:
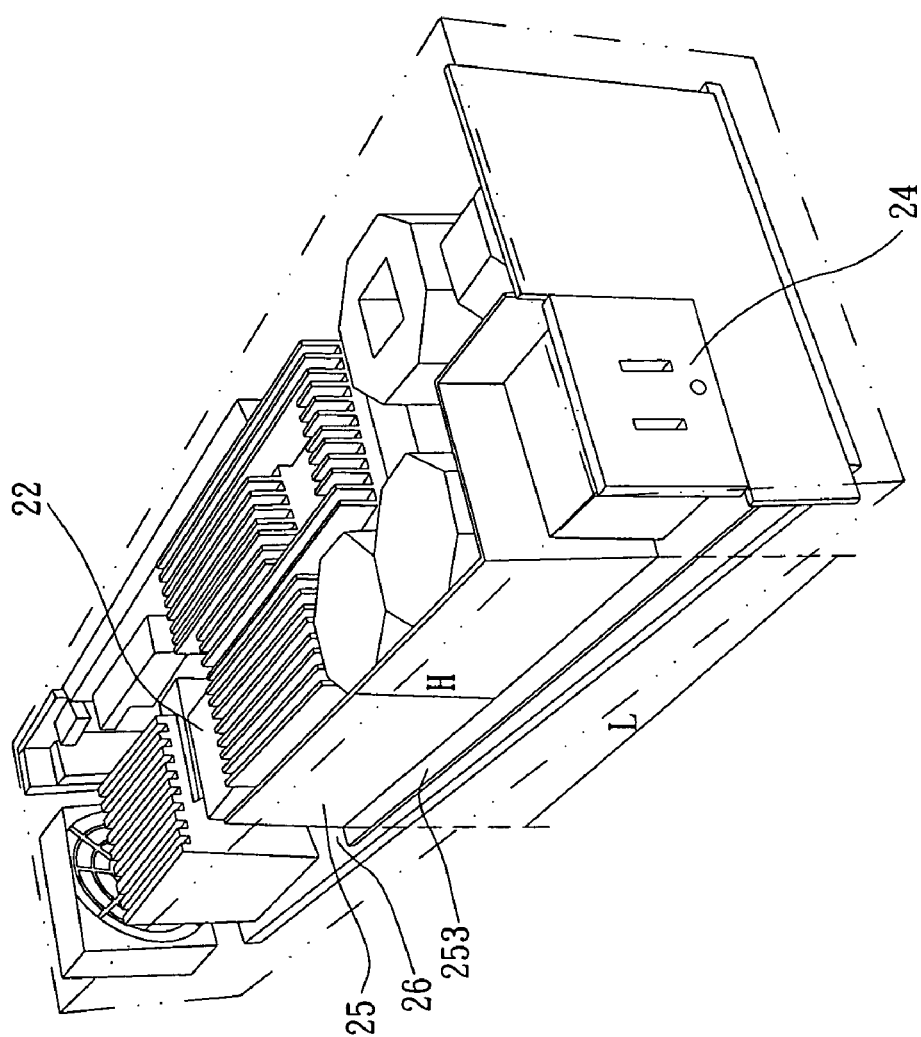
FIG. 5 is a schematic diagram showing an electronic device having a heat-dissipating structure for a socket according to a fourth preferred embodiment of the present invention.

The length L and the height H of the airflow directing plate 25 can be varied according to the design parameters. As shown in FIG. 5, the airflow directing plate 25 has smaller height H and length L, but it can also form the airflow channel 26 for directing air with lower temperature to the socket 24 to dissipate heat of the socket 24, and simultaneously reduce the material cost. In an embodiment, when the height H of the airflow directing plate 25 is smaller, the airflow directing plate further comprises a horizontal portion 253 at the bottom thereof for forming the airflow channel 26 that is separated from said electronic components 22.

Figure 6:
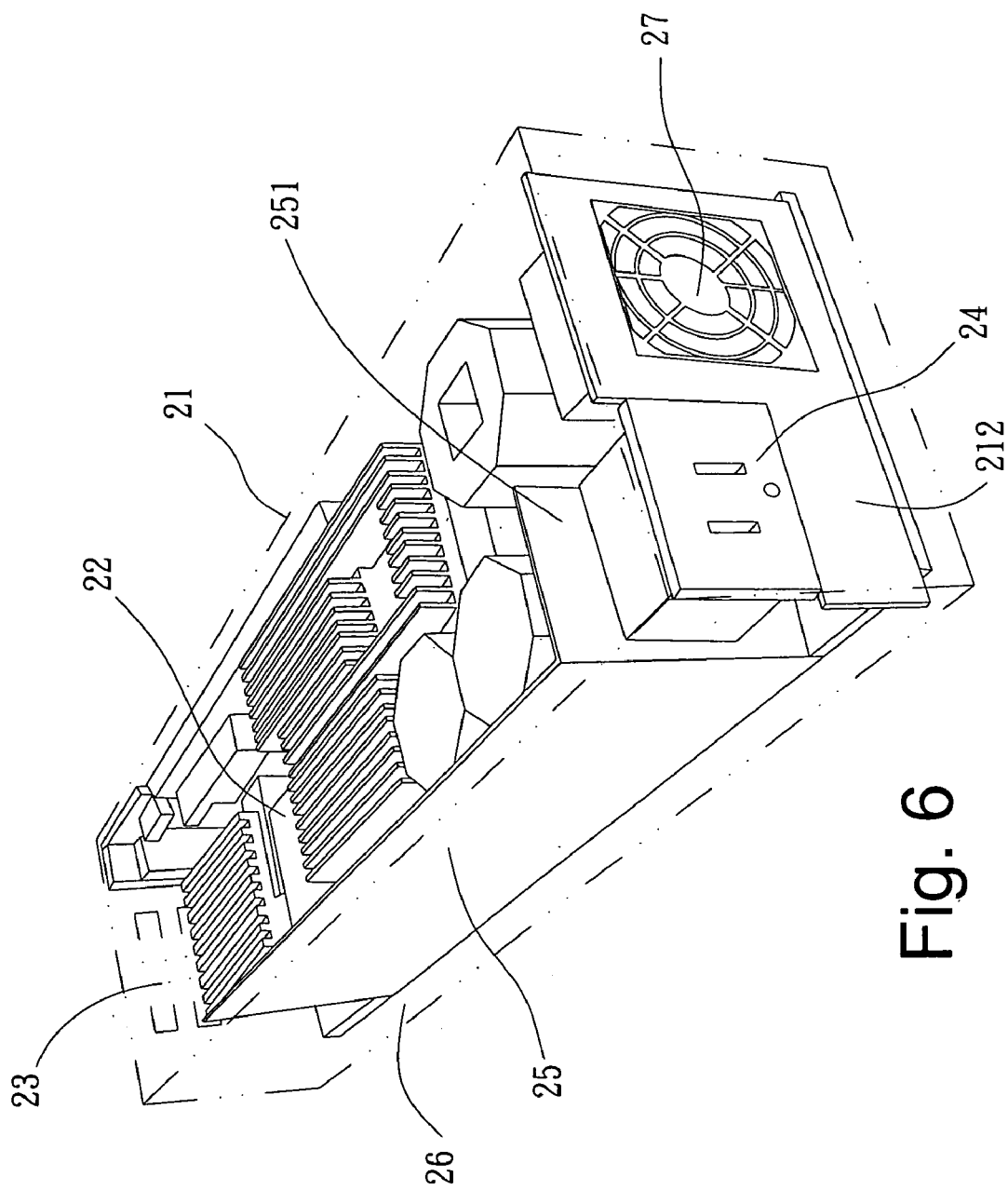
FIG. 6 is a schematic diagram showing an electronic device having a heat-dissipating structure for a socket according to a fifth preferred embodiment of the present invention.

In addition, in an embodiment, the fan 27 in the power supply of the present invention can be disposed at the second side 212 of the case 21 as the socket 24 is (as shown in FIG. 6), for blowing the hot air out of the case 21 to reduce the temperature in the case 21. In such allocation, the blowing force of the fan 27 can also direct a portion of air at the airflow inlet 23 to the socket 24 through the airflow channel 26 and dissipate heat of the socket 24. In this embodiment, the airflow directing plate 25 also comprises the second portion 251 disposed between the socket 24 and the electronic components 22 for blocking the heat generated by the electronic components 22 under operation from conducting to the socket 24 to lower down the temperature of the socket 24.

In the above embodiments, the airflow directing plate 25 is preferably shaped as a flat board but not limited thereto. For example, it can be formed in an irregular shape to stay close to the electronic components 22.

Figure 7:
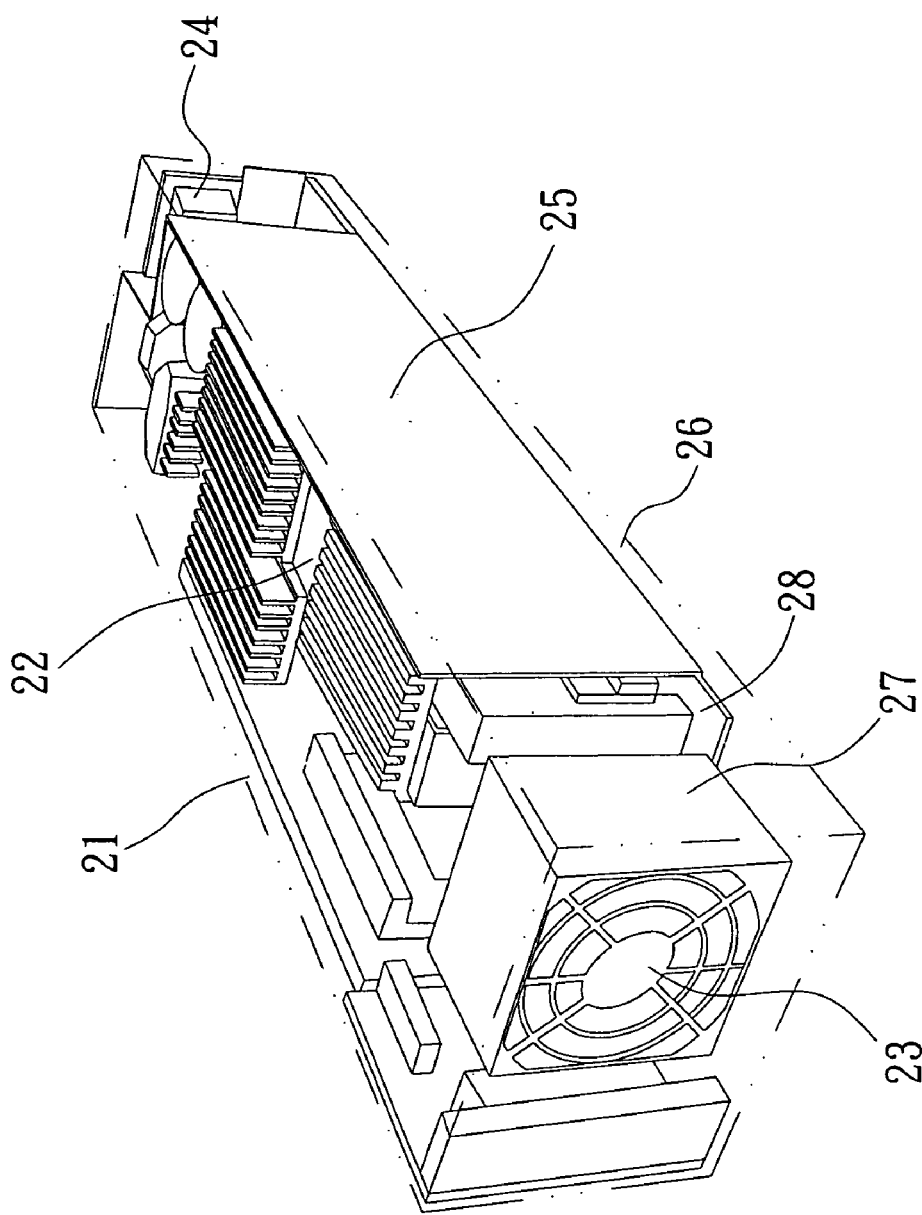
FIG. 7 is a schematic diagram showing an electronic device having a heat-dissipating structure for a socket according to a sixth preferred embodiment of the present invention.

On the other hand, except being formed from the insulating piece, the airflow directing plate 25 can be formed by other means. For example, the airflow directing plate 25 of the present invention can be formed from a non heat-generating or low heat-generating component in the power supply, such as PCB or large capacitor. As shown in FIG. 7, the airflow directing plate 25 is formed by bending the PCB 28 upwardly and away from the case 21 a specific distance, so as to form the airflow channel 26 between the airflow directing plate 25 and the case 21 for directing a portion of air at the airflow inlet 23 to the socket 24 through the airflow channel 26 and dissipating heat of the socket 24.

In conclusion, the present invention provides an electronic device having a heat-dissipating device for a socket, and the main feature of the present invention is that the electronic device comprises an airflow directing plate, which forms an airflow channel with the case of the electronic device for directing a portion of air at the airflow inlet to the socket through the airflow channel and dissipating heat of the socket, so as to conform to the safety standard of the socket temperature. Moreover, the airflow directing plate has an insulation effect for insulating the electronic components and the case. Therefore, the present invention overcomes the disadvantages of the prior art and possesses industrial value.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An electronic device having a heat-dissipating structure for a socket, comprising:
   a case;
   a plurality of electronic components disposed in said case;
   an airflow inlet disposed at a first side of said case;
   a socket disposed at a second side of said case, wherein said second side is opposite to said first side and said electronic components are disposed between said first side and said second side; and
   an airflow directing plate disposed between said case and said electronic components and forming an airflow channel with said case for directing a portion of air at said airflow inlet to said socket through said airflow channel so as to dissipate heat of said socket.

2. The electronic device having a heat-dissipating structure for a socket according to claim 1 wherein said electronic device is a power supply.

3. The electronic device having a heat-dissipating structure for a socket according to claim 1 further comprising a fan for dissipating heat of said electronic components.

4. The electronic device having a heat-dissipating structure for a socket according to claim 3 wherein said fan is disposed at said first side of said case.

5. The electronic device having a heat-dissipating structure for a socket according to claim 3 wherein said fan is disposed at said second side of said case.

6. The electronic device having a heat-dissipating structure for a socket according to claim 1 wherein said airflow directing plate is made of an insulating material.

7. The electronic device having a heat-dissipating structure for a socket according to claim 1 wherein said airflow directing plate is formed by bending an insulating piece disposed on the top of said case downwardly.

8. The electronic device having a heat-dissipating structure for a socket according to claim 1 wherein said airflow directing plate further comprises a second portion disposed between said electronic components and said socket for isolating heat generated by said electronic components.

9. The electronic device having a heat-dissipating structure for a socket according to claim 1 wherein said airflow directing plate further comprises a horizontal portion at the bottom thereof for forming said airflow channel that is separated from said electronic components.

10. The electronic device having a heat-dissipating structure for a socket according to claim 1 wherein said airflow directing plate is formed from a non heat-generating or low heat-generating component.

11. The electronic apparatus according to claim 10 wherein said non heat-generating or low heat-generating component is a PCB or large capacitor.

12. An electronic device having a heat-dissipating structure for a socket, comprising:
    a case;
    a plurality of electronic components disposed in said case;
    an airflow inlet disposed at a first side of said case;
    a socket disposed at a second side of said case, wherein said second side is opposite to said first side and said electronic components are disposed between said first side and said second side; and
    an insulating piece for insulating said electronic components and said case, wherein a specific distance exists between said insulating piece and said case to form an airflow channel therebetween for directing a portion of air at said airflow inlet to said socket through said airflow channel so as to dissipate heat of said socket.

13. The electronic device having a heat-dissipating structure for a socket according to claim 12 wherein said electronic device is a power supply.

14. The electronic device having a heat-dissipating structure for a socket according to claim 12 further comprising a fan for dissipating heat of said electronic components.

15. The electronic device having a heat-dissipating structure for a socket according to claim 14 wherein said fan is disposed at said first side of said case.

16. The electronic device having a heat-dissipating structure for a socket according to claim 14 wherein said fan is disposed at said second side of said case.

17. The electronic device having a heat-dissipating structure for a socket according to claim 12 wherein said insulating piece is formed by bending an insulating piece disposed on the top of said case downwardly.

18. The electronic device having a heat-dissipating structure for a socket according to claim 12 wherein said insulating piece further comprises a second portion disposed between said electronic components and said socket for isolating heat generated by said electronic components.

19. The electronic device having a heat-dissipating structure for a socket according to claim 12 wherein said insulating piece further comprises a horizontal portion at the bottom thereof for forming said airflow channel that is separated from said electronic components.

* * * * *